United States Patent [19]
Sigai et al.
[11] Patent Number: 4,778,581
[45] Date of Patent: Oct. 18, 1988

[54] METHOD OF MAKING FLUORESCENT LAMP WITH IMPROVED LUMEN OUTPUT

[75] Inventors: A. Gary Sigai, Lexington; John M. Flaherty, Peabody, both of Mass.

[73] Assignee: GTE Laboratories Incorporated, Waltham, Mass.

[21] Appl. No.: 15,752

[22] Filed: Feb. 17, 1987

Related U.S. Application Data

[62] Division of Ser. No. 334,095, Dec. 24, 1981, Pat. No. 4,670,688.

[51] Int. Cl.[4] .......... C23C 14/42
[52] U.S. Cl. .......... 204/192.15; 204/192.22; 313/489
[58] Field of Search .......... 204/192.15, 192.22, 204/192.26, 192.27, 192.28, 192.29; 313/489, 486

[56] References Cited

U.S. PATENT DOCUMENTS

| | | | |
|---|---|---|---|
| 2,386,277 | 10/1945 | Smith | 318/489 X |
| 4,124,474 | 11/1978 | Bomchil et al. | 204/192.15 X |
| 4,209,375 | 6/1980 | Gates et al. | 204/192.15 X |

*Primary Examiner*—John F. Niebling
*Assistant Examiner*—Nam X. Nguyen
*Attorney, Agent, or Firm*—Ivan L. Ericson

[57] ABSTRACT

The lumen output of a fluorescent lamp is improved by the triode radio frequency sputter coating of a continuous protective coating of vitreous alumina overlying the lamp phosphor layer.

1 Claim, 1 Drawing Sheet

METHOD OF MAKING FLUORESCENT LAMP WITH IMPROVED LUMEN OUTPUT

This is a divisional of co-pending application Ser. No. 334,095 filed on Dec. 24, 1981, now U.S. Pat. No. 4,670,688.

CROSS REFERENCE TO RELATED APPLICATION

A co-pending patent application, Ser. No. 228,865, filed Jan. 27, 1981, entitled "ARC DISCHARGE LAMP HAVING IMPROVED LUMEN MAINTENANCE", by Fred R. Taubner et al, assigned to GTE Products Corporation, one of the assignees of this application, concerns related subject matter.

FIELD OF THE INVENTION

This invention relates to fluorescent lamps which comprise a low pressure discharge through mercury vapor producing ultraviolet radiation which excites a phosphor layer on the interior surface of the fluorescent lamp envelope to produce light. More particularly, this invention relates to a protective coating overlying the phosphor layer in the fluorescent lamp.

BACKGROUND OF THE INVENTION

Commercially available fluorescent lamps comprise an elongated tubular envelope having a pair of electrodes sealed into the opposite ends thereof. The envelope contains a gaseous atmosphere, which has a mixture of a rare gas and a metal vapor, such as mercury vapor. The interior surface of the envelope is coated with a finely-divided phosphor which is exposed to the electrical discharge between the two electrodes, and is excited by the ultraviolet radiations emitted by this discharge. The phosphor layer is usually applied by suspending a particulate phosphor material in a suitable binder, flushing the interior surface of the envelope with the suspension, permitting the excess suspension to drain out of the envelope, and then heating the interior surface of the coated envelope to a temperature which promotes adherence of the coating to the envelope interior surface and removes, generally by volatilization, the binder material. There results a phosphor layer adhered to the interior surface of the tubular envelope.

While the lamp is operating, the phosphor is in a mercury vapor discharge where it is subjected to ultraviolet radiation and bombardment by electrons and mercury atoms and ions. These factors may be responsible for lamp maintenance losses; i.e., for the time-dependent decrease in light output found in all fluorescent lamps compared to the original light output.

Various uses of alumin within fluorescent lamps have been proposed in an attempt to alleviate the deleterious effects of the short wavelength ultraviolet radiation and mercury vapor exposure. For example, U.S. Pat. Nos. 4,079,288 and 4,058,639, as well as others, discuss employing a layer of alumina on the interior surface of the fluorescent lamp envelope and applying phosphor thereon.

U.S. Pat. No. 3,886,396 teaches the application of a thin, porous, discontinuous layer of alumina being applied over the phosphor layer, and U.S. Pat. No. 2,386,277 teaches the applicationof a thin, non-vitreous transparent layer of alumina being applied over the phosphor layer also. While all of these techniques provide some benefits of varying degrees, none of them improve the initial lamp brightness.

OBJECTS OF THE INVENTION

It is an object of the present invention to provide an improved fluorescent lamp.

It is another object of this invention to provide an improved fluorescent lamp with a phosphor therein having a protective coating thereon.

It is a further object of this invention to provide a protective coating for fluorescent lamp phosphors which absorbs short wavelength ultraviolet radiation while transmitting the longer wavelength of ultraviolet radiation effective in exciting lamp phosphors to fluorescence.

It is a further object of this invention to provide a protective coating for fluorescent lamp phosphors which is stable under the conditions required for fluorescent lamp manufacture and in the environment of an operating lamp.

SUMMARY OF THE INVENTION

These and still further objects, features and advantages of the invention are achieved, in accordance therewith, by providing a light transparent envelope containing an ionizable medium which includes mercury vapor, electrodes sealed into the ends of the envelope, and a layer of phosphor on the interior surface of the envelope. In accordance with the invention, the layer of phosphor on the interior surface is coated with a continuous protective coating of vitreous alumina which preferentially absorbs short wavelength ultraviolet radiation and transmits the longer wavelength ultraviolet radiation. The continuous protective coating of vitreous alumina is formed by triode sputtering of alumina from an aluminum oxide target.

For a better understanding of the present invention, together with other and further objects, advantages and capabilities thereof, reference is made to the following disclosure and appended claims in connection with the above-described drawings.

DETAILED DESCRIPTION OF THE PREFERRED EMBODIMENT

Figure 1:
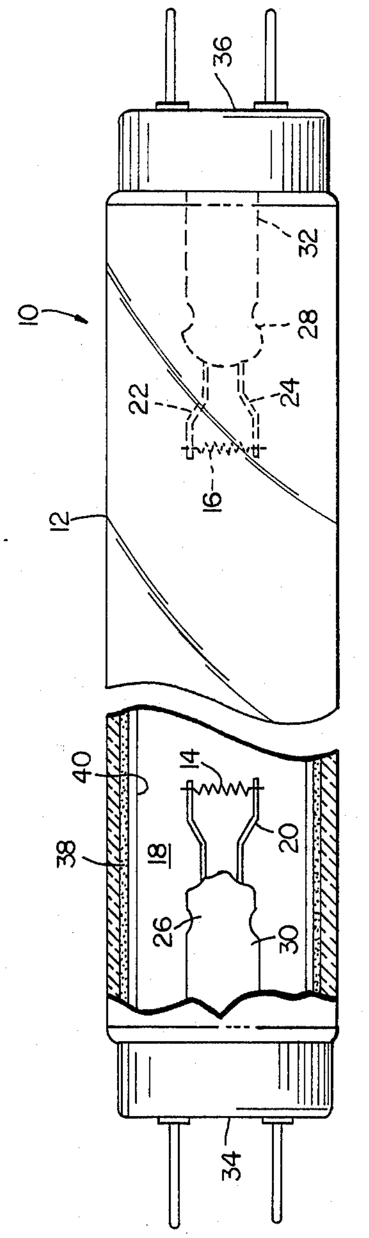
FIG. 1 is a view of a fluorescent lamp, partially in section, diagrammatically illustrating the invention.
Figure 2:
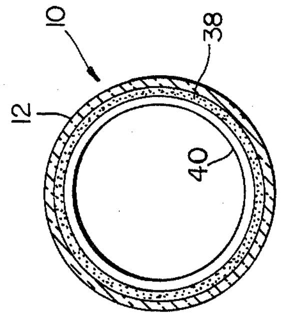
FIG. 2 is a cross-sectional view of the fluorescent lamp of FIG. 1.

Referring now to the drawings with greater particularity, there is shown in FIG. 1 a fluorescent lamp 10. Lamp 10 is comprised of an elongated sealed glass envelope 12 of circular cross section. It has the usual electrodes 14 and 16 at each end supported by lead-in wires 18, 20 and 22, 24, respectively, which extend through glass presses 26, 28 in mount stems 30, 32 to the contacts in bases 34, 36 affixed to the ends of the lamp 10.

Envelope 12 is filled with an inert gas such as argon or a mixture of argon and neon at a low pressure, for example, two torr, and a small quantity of mercury, at least enough to provide a low vapor pressure of about six microns during operation.

The interior of envelope 12 is coated with a layer of phosphor 38 such, for example, as a calcium halophosphate activated by antimony and manganese.

A phosphor coating suspension was prepared by dispersing the phosphor particles in a water base system employing polyethylene oxide as the binder with water as the solvent.

The phosphor suspension was applied in the usual manner of causing the suspension to flow down the inner surface of envelope 12 and allowing the water to evaporate, leaving the binder and phosphor particles adhered to the envelope 12 wall. The phosphor coated envelope 12 was then heated in a lehr to volatilizethe organic components, the phosphor layer 38 remaining on the envelope 12 wall.

The phosphor layer 38 is then coated with a layer 40 of vitreous alumina, thus forming a continuous protective coating 40 of vitreous alumina overlying the phosphor layer 38. The protective alumina coating 40 should be less than about 500 angstroms thick.

Envelope 12 is processed into a fluorescent lamp by conventional lamp manufacturing techniques.

While a fluorescent lamp 10 is operating, the phosphor which coats the interior wall of the lamp envelope is exposed to high energy ultraviolet radiation and bombardment by electrons and mercury atoms and ions. Eighty percent of the radiation emitted by excited mercury atoms and ions at the low vapor pressures found in fluorescent lamps occurs at 254 nanometers wavelength. This radiation, absorbed by phosphor layer 38 in the lamp 10, excites a broad band fluorescence of visible light. However, approximately 14 percent of the ultraviolet radiation emitted by excited mercury occurs at 185 nanometers wavelength. The 185 nanometers wavelength radiation contributes to maintenance losses in the phosphor, either through discoloration of the material, or through interference with the mechanism of fluorescent emission.

It has been found that a continuous coating of vitreous alumina overlying the phosphor layer substantially increases the lamp brightness, reduces the maintenance loss and reduces the color shift of the fluorescent lamp during operation.

It is believed that the vitreous alumina preferentially absorbs the short wavelength ultraviolet radiation, 185 nanometers, and transmits the 254 nanometer wavelength; thereby minimizing the deleterious effect of 185 nanometer wavelength radiation on the phosphor.

EXAMPLE

In one example the protective continuous vitreous alumina coating was made by triode radio-frequency sputtering of alumina from a high-purity (99.998%) aluminum oxide target.

The alumina coating was deposited on a cool-white phosphor layer (calcium halophosphate activated with antimony and manganese) which was previously deposited on a microscope slide by conventional slurry techniques, followed by heating in air at 550° C. for three minutes.

Half of the phosphor coated microscope slides were coated with alumina; the other half were used as controls. The alumina coating was applied at various thicknesses, i.e., 120 Å, 260 Å and 490 Å.

The prepared microscope slides were inserted and sealed into four foot T12 40 watt and five foot T8 65 watt fluorescent lamps.

The brightness of the alumina coated and uncoated control samples were monitored with time using a brightness spotmeter. The relative brightness measurement or figure of merit (%) was determined by calculating the ratio of the alumina coated phosphor samples versus the uncoated phosphor control samples.

Shown in Tables I and II were the Figures of Merit for the alumina coated phosphors in the four foot T12 and five foot T8 lamps for thickness of alumina at 120 Å, 260 Å and 490 Å as a function of time.

In most cases, the initial brightness readings were higher for the alumina coated phosphors compared to the uncoated control. This improved brightness was as much as 9.5 percent better than the control.

In the case of the five foot T8 lamps which characteristically exhibited inferior maintenance characteristics compared to the four foot T12 lamps for the cool-white phosphor systems, the maintenace improved relative to the uncoated control samples with time.

This unexpected improvement in lamp brightness is attributed to the physical characteristics of the alumina protective coating of the present invention. A forementioned U.S. Pat. No. 2,386,277 teaches the use of a non-vitreous transparent alumina as a protective coating in a fluorescent lamp and that only the lamp maintenance loss is improved, not the lamp brightness.

Electron diffraction measurements indicate there is no long range order present in the alumina coating of the present invention. This lack of long range order indicates the alumina coating of the present invention is not crystalline but vitreous in nature, and electron spectroscopic chemical analysis (ESCA) measurements of the alumina coated phosphor samples show none of the phosphor components indicating a true continuous protective layer of alumina with no phosphor unprotected by the alumina coating.

Fluorescence spectrophotometric measurements show a slight color shift of the uncoated control samples as a function of time, but the color shift of the alumina coated samples is less.

While there has been shown and described what is at present considered the preferred embodiment of the invention, it will be obvious to those skilled in the art that various changes and modifications may be made therein without departing from the scope of the invention as defined by the appended claims.

TABLE I

Lamp Brightness of 4 ft. T12 40 Watt Lamps, With Protective $Al_2O_3$ Coating Overlying A Cool White Phosphor $$\text{Figure of Merit (\%)} = \frac{\text{Coated Brightness}}{\text{Uncoated Brightness}} \times 100$$

| | Figure of Merit (%) Thickness | | |
|---|---|---|---|
| Time, hrs. | 120Å | 260Å | 490Å |
| 24 | 109.5 | 106.5 | 103.8 |
| 192 | 100.8 | 100.0 | 95.9 |
| 432 | 92.7 | 96.5 | 88.5 |
| 1006 | 100.8 | 97.8 | 96.3 |
| 1512 | 108.7 | 101.4 | 101.8 |
| 2374 | 108.3 | 105.8 | 91.8 |
| 3527 | 103.0 | 102.6 | — |
| 4585 | 92.3 | 92.9 | — |
| 5527 | 85.8 | 83.3 | 92.8 |
| 6673 | 95.5 | 90.4 | 84.0 |
| 7440 | 91.9 | 99.3 | 90.0 |
| 8352 | 100.2 | 98.4 | 91.2 |
| 9624 | 100.0 | 98.0 | 92.1 |

TABLE II

Lamp Brightness of 5 ft. T8 65 Watt Lamps With Protective $Al_2O_3$ Coating Overlying A Cool White Phosphor $$\text{Figure of Merit (\%)} = \frac{\text{Coated Brightness}}{\text{Uncoated Brightness}} \times 100$$

| | Figure of Merit (%) | | |
|---|---|---|---|
| | Thickness | | |
| Time, hrs. | 120Å | 260Å | 490Å |
| 10 | 107.3 | 108.8 | 81.9 |
| 227 | 108.7 | 107.7 | 90.6 |
| 442 | 112.9 | 106.9 | 91.2 |
| 990 | 113.3 | 111.7 | 90.5 |
| 1465 | 116.2 | 125.7 | 89.5 |
| 2506 | 118.9 | 117.5 | 92.7 |
| 3462 | 128.8 | 131.6 | 95.8 |
| 4583 | 125.0 | 128.1 | 93.9 |

TABLE II-continued

Lamp Brightness of 5 ft. T8 65 Watt Lamps With Protective $Al_2O_3$ Coating Overlying A Cool White Phosphor $$\text{Figure of Merit (\%)} = \frac{\text{Coated Brightness}}{\text{Uncoated Brightness}} \times 100$$

| | Figure of Merit (%) | | |
|---|---|---|---|
| | Thickness | | |
| Time, hrs. | 120Å | 260Å | 490Å |
| 5395 | 126.9 | 130.1 | 94.8 |
| 6462 | 128.3 | 127.6 | 100.0 |
| 7351 | 131.4 | 126.5 | 94.7 |
| 8667 | 128.2 | 135.4 | 92.1 |
| 9536 | 137.2 | 132.4 | 98.0 |

What is claimed is:

1. A process for applying a continuous protective coating of vitreous alumina overlying a layer of phosphor comprising:

heating a layer of phosphor in air at about 550° C.; and triode radio frequency sputtering of alumina from an aluminum oxide target onto said phosphor layer to form a continuous protective coating of vitreous alumina overlying said layer of phosphor.

* * * * *